United States Patent [19]
Kiel et al.

[11] Patent Number: 5,276,898
[45] Date of Patent: Jan. 4, 1994

[54] SYSTEM FOR SELECTIVELY COMPRESSING DATA FRAMES BASED UPON A CURRENT PROCESSOR WORK LOAD IDENTIFYING WHETHER THE PROCESSOR IS TOO BUSY TO PERFORM THE COMPRESSION

[75] Inventors: Harvey G. Kiel; Robert J. Manulik, both of Rochester, Minn.

[73] Assignee: International Business Machines Corporation, Armonk, N.Y.

[21] Appl. No.: 558,021

[22] Filed: Jul. 26, 1990

[51] Int. Cl.⁵ .............................................. G06F 13/00
[52] U.S. Cl. .................................... 395/800; 358/426; 364/514; 364/260.6; 364/DIG. 1; 375/122; 382/56; 395/650
[58] Field of Search ............... 395/800, 325, 650, 200; 341/67; 364/514; 375/122; 358/213.25, 426; 382/56

[56] References Cited

U.S. PATENT DOCUMENTS

| | | | |
|---|---|---|---|
| 4,386,416 | 5/1983 | Giltner et al. | 395/375 |
| 4,598,411 | 7/1986 | Berkovich et al. | 375/27 |
| 4,631,598 | 12/1986 | Burkhardt et al. | 358/425 |
| 4,633,490 | 12/1986 | Goertzel et al. | 375/122 |
| 4,663,660 | 5/1987 | Fedele et al. | 358/136 |
| 4,684,923 | 8/1987 | Koga | 341/63 |
| 4,700,234 | 10/1987 | Nagashima | 358/426 |
| 4,823,342 | 4/1989 | Morita et al. | 370/109 |
| 4,876,541 | 10/1989 | Storer | 341/51 |
| 4,905,171 | 2/1990 | Kiel et al. | 364/551.01 |
| 4,965,754 | 10/1990 | Stansfield et al. | 364/526 |
| 5,031,089 | 7/1991 | Liu et al. | 395/725 |

FOREIGN PATENT DOCUMENTS

| | | |
|---|---|---|
| 0123783 | 11/1984 | European Pat. Off. |
| 0316250A3 | 5/1989 | European Pat. Off. |
| 59-189751 | 10/1984 | Japan |
| 61-198941 | 9/1986 | Japan |
| 63-203057 | 8/1988 | Japan |

OTHER PUBLICATIONS

IEEE Transactions on Instrumentation and Measurement vol. IM-28, No. 4, Dec. 1979, New York U.S. pp. 306-311 H Ikeda et al.: "Microprocessor-controlled time-sharing services terminal with interfaces for instruments and its application to precision measurement of high VSWR".

*Primary Examiner*—Thomas C. Lee
*Assistant Examiner*—Paul Harrity
*Attorney, Agent, or Firm*—Joan Pennington; Richard E. Billion; Bradley A. Forrest

[57] ABSTRACT

A method and computer system having a processor are provided for selectively compressing a data communication frame for data transfer between the computer system and at least one other system. A processor work load is periodically identified for the processor. A predetermined stored threshold value is identified and compared with the identified processor work load. Responsive to an identified processor work load greater than the identified predetermined threshold value, the data communication frame is transmitted without compressing the data communication frame. Otherwise the data communication frame is compressed and then transmitted responsive to an identified processor work load less than or equal to the identified predetermined threshold value. A state of a communication line is identified for the data transfer. Responsive to an identified idle state of the communication line, the data communication frame is transmitted without compressing the data communication frame.

17 Claims, 3 Drawing Sheets

SYSTEM FOR SELECTIVELY COMPRESSING DATA FRAMES BASED UPON A CURRENT PROCESSOR WORK LOAD IDENTIFYING WHETHER THE PROCESSOR IS TOO BUSY TO PERFORM THE COMPRESSION

BACKGROUND OF THE INVENTION

1. Field of the Invention

The present invention relates generally to data communications using data compression, and more particularly to a method and a computer system for dynamic management of data compression.

2. Description of the Prior Art

Data compression has been increasingly used because it provides improved communications performance by reducing the amount of transmitted data and/or reduces the cost of data communications. Data compression is used on various known communications controllers.

Various compression algorithms have been employed for data compression. Examples of data compression algorithms are disclosed in U.S. Pat. Nos. 4,386,416, 4,663,490, 4,663,660 and 4,684,923.

U.S. Pat. No. 4,631,598 discloses an image processing system including a video converter board that transmits data to a spatial compressor board which compresses data electronically in the x-direction or the direction of the linear array. Data compression in the y-direction is accomplished by motor speed control movement of the document. A scanner controller provides data compression for the end user to match the data handling capabilities of the end user system. The image processing system uses automatic thresholding techniques with respect to grey scale and edge detection threshold parameters.

U.S. Pat. No. 4,598,411 discloses a data compression system for compressing data transmitted between a data source and an ultimate utilization device. Data is compressed "on-the-fly" in that the data is compressed as it is transmitted, instead of compressing and storing the compressed data in memory before it is transmitted.

Japanese patent No. 59189751 issued Oct. 27, 1984 to Nakayama et al., discloses a data transmission control system including a central processing unit (CPU) and a communication controller (CCU). Image data is sent to the CCU by the control of the CPU. The CCU transfers received data to an attachment corresponding to a line through which data should be transmitted. In the attachment, a start part of the image data is read to determine whether or not the data is compressed. If the data from the CPU is not compressed, the CCU compresses the data before it is transmitted. Otherwise, if the data from the CPU is compressed, the CCU will bypass the compression step and transmit the data in its existing compressed form.

One significant disadvantage of the above and many of the known data compression methods is that degraded performance can result. Data compression adds to the processing overhead and can result in inefficiency in the processor system. When the processor utilization is high, data compression further increases the processor utilization resulting in degraded performance. Another problem is that data compression may not result in any actual data transmission savings. The time spent either attempting to or providing the data compression can cause a delay in the actual transmission of the data and degraded performance. For example, when using a high speed communication line and the communications hardware is idle, the time spent compressing data causes an overall delay for the start of data transmission.

U.S. Pat. No. 4,905,171 issued Feb. 27, 1990 to Harvey G. Kiel et al. and assigned to the present assignee, discloses a workstation controller (WSC) performance monitor for locating performance bottlenecks. Performance measurements are taken and processor utilization and communications line utilization are calculated. Processor utilization is calculated using an idle loop for generating an idle loop count and using the following equation:

$$\text{processor utilization} = \frac{(\text{elapsed time of test/idle loop time}) - \text{idle loop count}}{\text{elapsed time of test/idle loop time}}$$

where the idle loop count equals the number of times an idle loop was executed, the elapsed time of the test equals a predetermined time period for retrieving measurements, and the idle loop time is a constant equal to the time required to execute the idle loop once.

SUMMARY OF THE INVENTION

Important objects of the present invention are to provide an improved method and computer system for dynamically controlling the use of data compression for data communications; to provide such a data compression control method and computer system for comparing an identified processor utilization value to a predetermined threshold value and for compressing a data communication frame when the processor utilization value is less than or equal to the predetermined threshold value; to provide such a data compression control method and computer system for comparing an identified processor utilization value to a predetermined threshold value and for compressing the data communication frame using a first compression algorithm responsive to an identified processor utilization value greater than the threshold value; and for compressing the data communication frame using a second compression algorithm responsive to an identified processor utilization value less than or equal to the threshold value; to provide such a data compression control method and computer system for providing a compression selection flag representative of data compression being selected or not selected and for transmitting the compression selection flag to a receiving other system, the compression selection flag being used by the other system for either selecting or not selecting data compression; and to provide such a data compression control method and system for identifying a state of communication hardware and for compressing a data communication frame when the communication hardware is busy and for transmitting a data communication frame not compressed when the communication hardware is idle.

In brief, the objects and advantages of the present invention are achieved by a method and a computer system having a processor for selectively compressing a data communication frame for data transfer between the computer system and at least one other system. A processor utilization value is periodically identified for the processor. A predetermined stored threshold value is identified and compared with the identified processor utilization value. Responsive to an identified processor utilization value greater than the identified predetermined threshold value, the data communication frame is transmitted without compressing the data communication frame. Otherwise the data communication frame is compressed and then transmitted responsive to an identified processor utilization value less than or equal to the identified predetermined threshold value. A state of a communication line is identified for the data transfer. Responsive to an identified idle state of the communication line, the data communication frame is transmitted without compressing the data communication frame.

BRIEF DESCRIPTION OF THE DRAWINGS

The present invention together with the above and other objects and advantages may best be understood from the following detailed description of the embodiment of the invention illustrated in the drawings, wherein.

DETAILED DESCRIPTION OF THE PREFERRED EMBODIMENT

Figure 1:
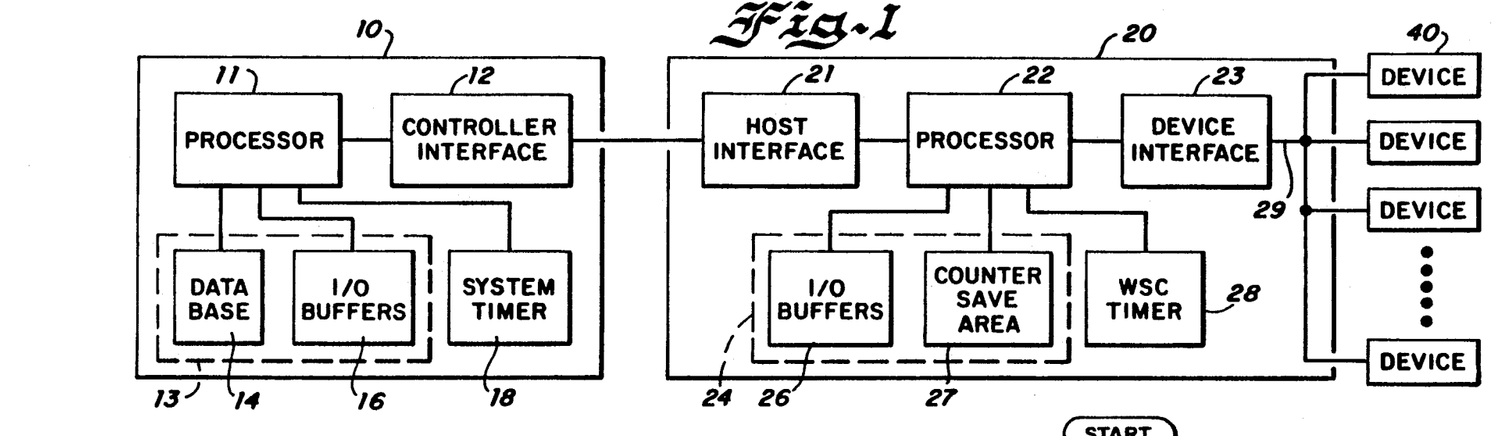
FIG. 1 is a block diagram of a communications system which may be employed in carrying out the data compression control method of the invention.

Referring now to the drawings, in FIG. 1 there is illustrated a block diagram representation of an exemplary data communications system for performing a data transfer compression control method of the invention. As illustrated, the exemplary data communications system includes a host generally designated by the reference numeral 10 and a workstation controller (WSC) 20 attached to a plurality of devices or work stations 40, such as personal computers (PCs), displays or printers. Host 10 has a processor 11 connected to a controller interface 12, a memory or storage 13 including a data base area 14 and input/output (I/O) buffers 16, and a system timer 18. Controller interface 12 communicates with the WSC 20 via line 17. Line 17 can be a system bus, communications line, part of a local area network or other communications arrangement. WSC 20 includes a processor 22 connected to a host interface 21, a device interface 23, a memory or storage 24 including I/O buffers 26 and a counter save area 27, and a WSC timer 28. Host interface 21 communicates with the host 10 over the communications line 17. Device interface 23 communicates with the devices 40 over a communications line 29. Processor 22 is a typical processor known to those in the art, suitably programmed to operated as described with respect to FIGS. 2-7. While the data compression control method is described below as being performed by the processor 22 of the WSC 20 for communications with the attached devices 40, it should be understood that the invention is not limited to this application and can be used with various communications controllers and computer systems.

Briefly in accordance with features of the present invention, data compression is done on a frame by frame basis, one frame may be compressed and a next frame may not be compressed. As illustrated and described with respect to FIGS. 2-7, an identified processor utilization value is analyzed and the state of the WSC communication hardware is analyzed before data compression is performed. An identified processor utilization value is compared with a stored processor utilization threshold value for the particular line speed. When the processor utilization value is greater than the threshold value, then data compression is bypassed. A flag representative of a data compression selection based upon the processor utilization value is passed to a receiving device 40 to indicate if the device 40 is to compress transmitted data frames so that the processor 22 will selectively receive compressed or not compressed data. When the WSC communication hardware is not transmitting or receiving data, then the data frame is not compressed. When the WSC communication hardware is busy, then a current data queue for the WSC communication hardware is compared with a stored threshold data queue value for the particular line speed. When the current queue value is greater than or equal to the threshold value, then the data frame is compressed.

Figures 2, 3:
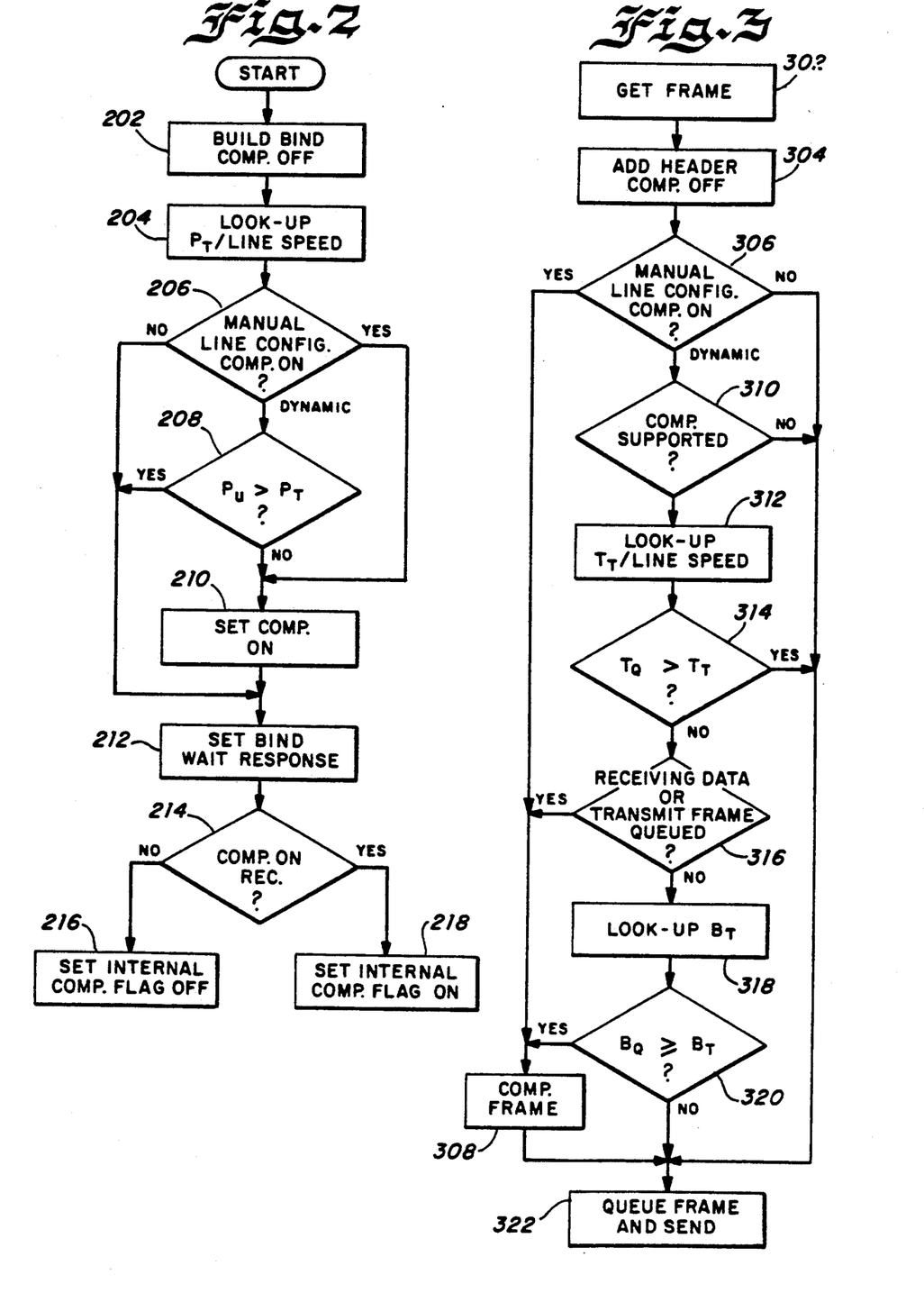
FIG. 2 is a flow chart illustrating logical steps performed by a processor of the communications system of FIG. 1 for defining a PC bring-up routine.
FIG. 3 is a flow chart illustrating logical steps performed by a processor of the communications system of FIG. 1 for transmitting a data communication frame.

Referring now to FIG. 2, there is shown a flow chart illustrating sequential steps performed by the processor 22 defining a PC bring-up routine. The sequential steps begin with building a bind or request to activate a session that includes a default setting for no compression as indicated by a block 202. Next the processor 22 identifies a processor utilization threshold value $P_T$ for the particular line speed for data transmission. The processor utilization threshold value $P_T$ is obtained from a stored look-up table including multiple processor utilization threshold values $P_T$ each with a particular line speed, for example, such as set forth in TABLE I as follows.

TABLE I

| LINE SPEED (bps) | PROCESSOR UTILIZATION THRESHOLD $P_T$ % |
| --- | --- |
| 1200 | 60 |
| 2400 | 60 |
| 4800 | 50 |
| 9600 | 40 |
| 19200 | 30 |
| 38400 | 30 |

Next an optional step can be performed to identify a manually entered line configuration compression selection of compression on, compression off or dynamically determining whether data compression is performed on a per communication frame basis, as represented at a block 206. When the dynamic compression selection is identified at block 206, then a last calculated processor utilization value $P_U$ is compared with the processor utilization threshold value $P_T$ identified at block 204 as represented by a decision block 208. One method for calculating processor utilization is disclosed by the above described U.S. Pat. No. 4,905,171 or alternatively, sampling techniques can be used to obtain the last calculated processor utilization value $P_U$. The disclosure of U.S. Pat. No. 4,905,171 is incorporated herein by reference.

When the last calculated processor utilization value $P_U$ is less than the identified threshold value $P_T$ at block 208, then the compression preferred flag in the bind is set for compression on as indicated by a block 210. Then the bind is sent and the processor 22 waits for a bind response from the PC or other device 40 as indicated by a block 212. Next a compression preferred flag is checked in the bind response as represented by a block 214. When the compression on flag is not set or is off, then data compression is not used and an internal compression flag is set to off as represented by a block 216. Otherwise when the compression on flag is set in the bind response, then data compression is used and an internal compression flag is set to on represented by a block 218.

Alternatively, when the last calculated processor utilization value $P_U$ is greater than the identified threshold value $P_T$ at block 208, then the compression preferred flag in the bind is set for compressing the data communication frame using a first compression algorithm. Further when the last calculated processor utilization value $P_U$ is less than or equal to the identified threshold value $P_T$ at block 208, then the compression preferred flag in the bind is set for compressing the data communication frame using a second compression algorithm. In this alternative method, the first compression algorithm requires less processor time than is required for the second compression algorithm.

Referring now to FIG. 3, there is shown a flow chart illustrating the sequential steps for transmitting a data communication frame. First a frame to be transmitted typically including 256 bytes of data is processed as represented by a block 302. A transmission header is added to the data communication frame that includes a default setting for no compression as represented by a block 304. Next an optional step can be performed to identify a manually entered line configuration compression selection for compression on, compression off or dynamically determining whether data compression is performed on a per communication frame basis, as represented at a block 306. When the line is manually configured as compression on at block 306, then the data communication frame is compressed, the frame length adjusted and the compression flag set to on in the transmission header as indicated at the block 308. When the dynamic compression selection is identified at block 306, then it is determined whether or not the particular device 40 supports compression as represented by a decision block 310. When it is determined that the device 40 supports compression at block 310, then a task threshold value $T_T$ for the particular line speed is obtained from a stored look up table of task threshold values $T_T$ with line speeds as represented by a block 312. TABLE II sets forth examples of task threshold values $T_T$ with line speeds as follows.

TABLE II

| LINE SPEED (bps) | PROCESSOR TASK THRESHOLD $T_T$ |
|---|---|
| 1200 | 5 |
| 2400 | 5 |
| 4800 | 4 |
| 9600 | 3 |
| 19200 | 2 |
| 38400 | 1 |

Next a number of queued tasks $T_Q$ for the processor 22 is compared with the identified task threshold value $T_T$ as indicated by a decision block 314. When it is determined that the number of queued tasks $T_Q$ is less than or equal to the identified task threshold value $T_T$ at block 314, then the communication line hardware is checked to determine if the communication line hardware is receiving data or if an additional complete transmit frame is queued waiting to be transmitted as represented by a decision block 316. When it is determined that the communication line hardware is receiving data or that an additional transmit frame is queued at block 316, then the data communication frame is compressed at the block 308. Otherwise when it is determined that the communication line hardware is not receiving data or that an additional transmit frame is not queued at block 316, then a send byte count threshold value $B_T$ for the particular line speed is identified from a stored look up table of byte count threshold values $B_T$. TABLE III sets forth examples of byte count threshold values $B_T$ with line speeds as follows.

TABLE III

| LINE SPEED (bps) | BYTE COUNT THRESHOLD $B_T$ |
|---|---|
| 1200 | 0 |
| 2400 | 0 |
| 4800 | 0 |
| 9600 | 10 |
| 19200 | 20 |
| 38400 | 40 |

Next a byte count $B_Q$ for the communication line hardware is checked and compared with the byte count threshold value $B_T$ obtained at block 318 as represented by a decision block 320. When the communication line hardware byte count $B_Q$ is greater than or equal to the byte count threshold value $B_T$, then data compression is performed at block 308. Otherwise when the communication line hardware byte count $B_Q$ is less than or equal to the byte count threshold value $B_T$, then data compression is not performed. Then the data communication frame is queued for the communication line hardware and sent as represented by a block 322. Also the data communication frame is queued for the communication line hardware without compressing the frame and sent at block 322 after a compression off selection is identified at block 306, or after it is determined that device 40 does not support compression at block 310, or after it is determined that more tasks $T_Q$ are queued for the processor than the identified task threshold value $T_T$ at block 314.

Figure 4:
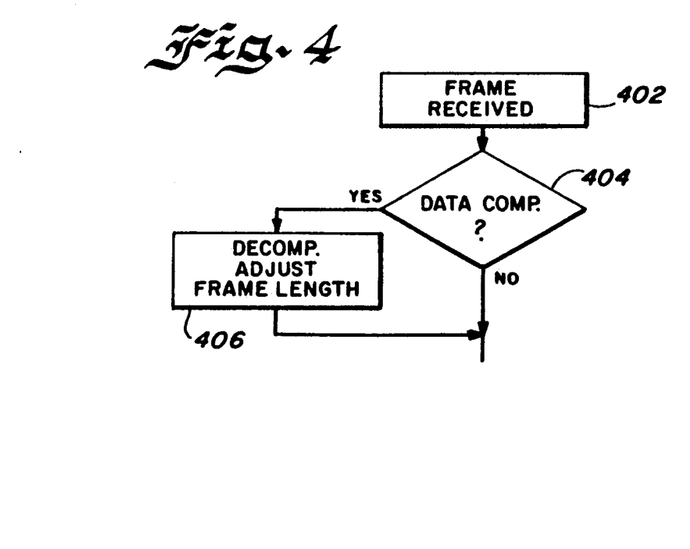
FIG. 4 is a flow chart illustrating logical steps performed by a processor of the communications system of FIG. 1 for receiving a data communication frame.

Referring now to FIG. 4, there is shown a flow chart illustrating the sequential steps for receiving a data communication frame. First a frame is processed as represented by a block 402. Next a data compression flag is checked to determine whether or not the received frame is compressed as represented by a decision block 404. When it is determined at block 404 that the received frame is compressed, then the data communication frame is decompressed and the frame length adjusted as represented by a block 406. Otherwise, the received frame is processed without being decompressed.

Figure 5:
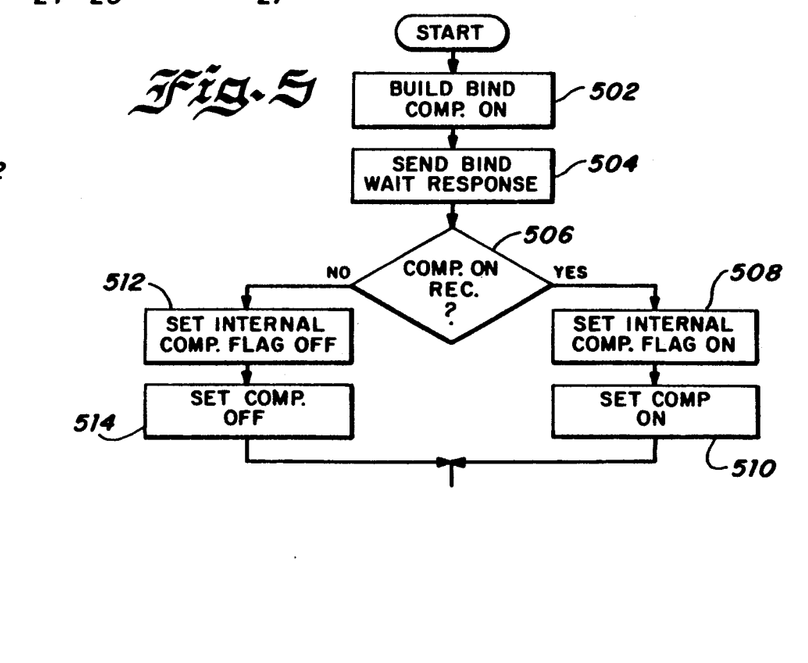
FIG. 5 is a flow chart illustrating logical steps performed by a processor of the communications system of FIG. 1 for defining an alternative PC bring-up routine.
Figures 6, 7:
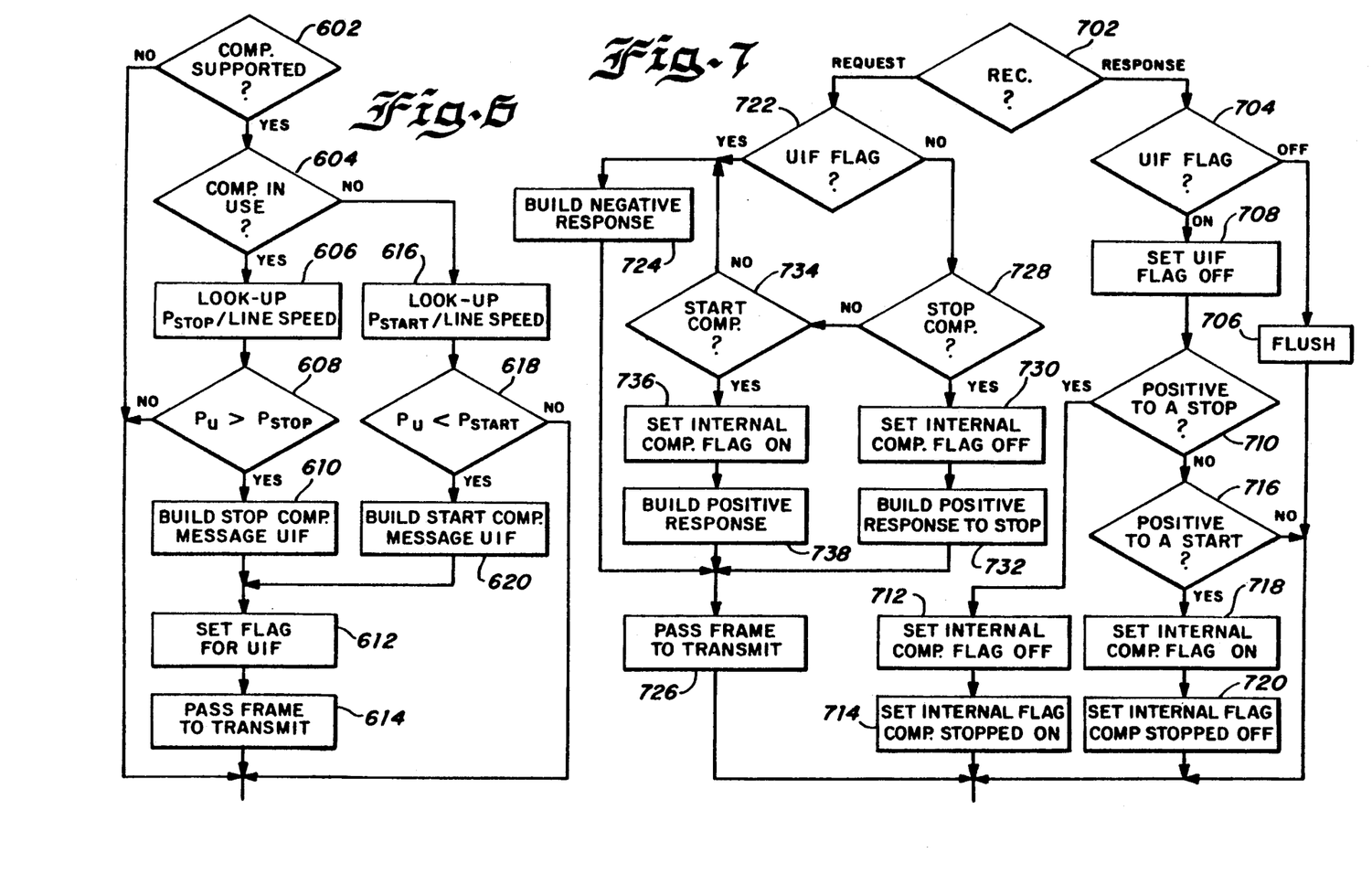
FIG. 6 is a flow chart illustrating logical steps performed by a processor of the communications system of FIG. 1 for defining a timer based module to periodically turn compression on and off during run time.
FIG. 7 is a flow chart illustrating logical steps performed by a processor of the communications system of FIG. 1 for defining an unnumbered information processing routing.

FIGS. 5-7 provide alternative flow charts of sequential steps performed by the processor 22 for periodic adjustment of compression/no compression or bind compression negotiation during run time. Referring now to FIG. 5, there is shown a flow chart illustrating alternative sequential steps performed by the processor 22 for the device bring-up routine. The sequential steps begin with building a bind that includes a default setting for compression on as indicated by a block 502. Next the processor 22 sends the bind and waits for a bind response from the device 40 as indicated by a block 504. Next a compression preferred flag is checked in the bind response as represented by a block 506. When the compression preferred flag is set on in the bind response identified at block 506, then data compression is used and the internal compression flag is set to on as represented by a block 508 and the compression preferred flag is set to on as represented by a block 510. Otherwise when the compression preferred flag is not set or is off, then data compression is not used and the internal compression flag is set to off as represented by a block 512 and the compression preferred flag is set to off as represented by a block 514.

Referring to FIG. 6, there is shown a flow chart illustrating the sequential steps performed by the processor 22 defining a timer based module to periodically turn compression on and off during run time. First it is determined if the device 40 supports compression and that the communications line can be dynamically configured as indicated by a decision block 602. When it is determined that the device 40 does not support compression or the communications line can not be dynamically configured at block 602, then no further processing is performed within the module. Otherwise when it is determined that the device 40 does support compression and the communications line can be dynamically configured at block 602, then it is determined if compression is currently being done as indicated at a block 604.

When it is determined that compression is currently being done at block 604, then a processor utilization stopping threshold value $P_{STOP}$ is identified for the particular line speed as indicated by a block 606. A stored look-up table can include multiple processor utilization threshold stopping and starting values $P_{START}$, $P_{STOP}$ each with a particular line speed. Next the identified stopping threshold value $P_{STOP}$ is compared with a last calculated processor utilization value $P_U$ as indicated by a decision block 608. When it is determined that the last calculated processor utilization value $P_U$ is less than or equal to the threshold stopping value $P_{STOP}$, then compression is left on and the routine is exitted. When it is determined that the last calculated processor utilization value $P_U$ is greater than the threshold stopping value $P_{STOP}$ at block 608, then a stop compression message is built in an unnumbered information frame (UIF) as indicated by a block 610. Then an internal flag is set indicative of an outstanding UIF as indicated at a block 612 and the frame is passed to be transmitted as indicated at a block 614. An unnumbered information processing routine for handling a response to the transmitted UIF at block 614 is illustrated and described with respect to FIG. 7.

Otherwise when it is determined that compression is not currently being done at block 604, then a processor utilization starting threshold value $P_{START}$ is identified for the particular line speed in the stored look up table as indicated by a block 616. Next the identified starting threshold value $P_{START}$ is compared with a last calculated processor utilization value $P_U$ and it is determined if data compression was stopped as represented by a decision block 618. When it is determined that the last calculated processor utilization value $P_U$ is less than or equal to the threshold starting value $P_{START}$ and it is determined that data compression was previously stopped at block 610, then a start compression message is built in an unnumbered information frame UIF as indicated by a block 620. Then an internal flag is set indicative of an outstanding UIF at block 612 and the frame is passed to be transmitted at block 614. Otherwise when it is determined that the last calculated processor utilization value $P_U$ is greater than the threshold starting value $P_{START}$ or it is determined that data compression was not previously stopped at block 610, then no further processing is performed within the module.

TABLE IV includes examples of processor utilization threshold starting and stopping values $P_{START}$, $P_{STOP}$ for multiple line speeds as follows.

TABLE IV

| LINE SPEED (bps) | PROCESSOR UTILIZATION THRESHOLD | |
|---|---|---|
| | $P_{START}$ % | $P_{STOP}$ % |
| 1200 | 50 | 65 |
| 2400 | 50 | 65 |
| 4800 | 40 | 55 |
| 9600 | 30 | 45 |
| 19200 | 25 | 40 |
| 38400 | 25 | 40 |

The sequential steps performed by the processor 22 defining the timer based module to periodically turn compression on and off during run time illustrated and described with respect to FIG. 6 are performed at different points in time for different communications lines to avoid an oscillation effect that otherwise could result from starting or stopping data compression on all communications lines at the same time.

Referring now to FIG. 7, there is shown a flow chart illustrating the sequential steps for handling a response to the transmitted UIF frame at block 614 of FIG. 6 defining the unnumbered information processing routine. First a request from the device 40 or a response from the device 40 to a transmitted request by the processor 22 is identified as indicated by a decision block 702. When a response from the device is identified at block 702, then it is determined if there is an outstanding UIF by checking if the UIF flag is set as indicated at a decision block 704. When it is determined that there is no outstanding UIF at block 704, then a flush is performed as indicated at a block 706. Otherwise when an outstanding UIF is identified at block 704, then the UIF flag is set to off as represented at a block 708. Next it is determined if this is a positive response to a stop as represented at a decision block 710. When a positive response to a stop is identified at block 710, then the internal compression flag is turned off to indicate that compression is not being done as represented at a block 712 and the internal compression stopped flag is set on to indicate that compression has been stopped by this system as represented at a block 714.

When a positive response to a stop compression is not identified at block 710, then it is determined if there is a positive response to a start compression as represented at a decision block 716. When a positive response to a start compression is identified at block 716, then the internal compression flag is turned on to indicate that compression is being done as represented at a block 718. Then the internal compression stopped by this system flag is set off to indicate that compression has not been stopped as represented at a block 720.

When a request from the device 40 is identified at block 702, then the outstanding UIF flag is checked as indicated at a decision block 722. When an outstanding UIF is identified at block 722, next a negative response is built as indicated at a block 724 and the frame is passed to be transmitted as indicated at a block 726. Otherwise when an outstanding UIF is not identified at block 722, then it is determined if there is a request to stop compression as represented at a decision block 728. When a request to stop compression is identified at block 728, then the internal compression flag is turned off to indicate that compression is not being done as represented at a block 730 and a positive response to a request to stop compression is built as represented at a block 732. Next the frame is passed to be transmitted as indicated at a block 726.

When a request to stop compression is not identified at block 728, then it is determined if there is a request to start compression as represented at a decision block 734. When a request to start compression is not identified at block 734, then a negative response is built at block 724 and the frame is passed to be transmitted at block 726. When a request to start compression is identified at block 734, then the internal compression flag is turned on to indicate that compression is being done as represented at a block 736. Next a positive response is built as indicated at a block 738 and then the frame is passed to be transmitted as indicated at a block 726.

While the invention has been described with reference to details of the illustrated embodiments, these details are not intended to limit the scope of the invention as defined in the appended claims.

We claim:

1. A method for selectively compressing each of a plurality of data communication frames for data transfer between a computer system having a processor and at least one other system, whereby each said data communication frame is selectively compressed based upon a current processor work load as determined by a processor utilization value, said method performed by the processor comprising the steps of:
periodically identifying the processor utilization value for the processor; said processor utilization value indicating said current processor work load;
identifying a predetermined threshold value;
before transmitting each said data communication frame, comparing said identified processor utilization value with said identified predetermined threshold value and based upon said comparison, determining whether or not said processor is too busy to perform a data communication frame compression;
transmitting the data communication frame without compressing the data communication frame responsive to an identified processor utilization value greater than said identified predetermined threshold value; and
dynamically compressing and transmitting the data communication frame responsive to an identified processor utilization value less than or equal to said identified predetermined threshold value.

2. The method as recited in claim 1 further comprising the steps of:
identifying a second predetermined threshold value;
comparing said identified processor utilization value with said identified second predetermined threshold value;
defining a compression selection flag representative of data compression selected responsive to said compared processor utilization value being less than said second predetermined threshold value or representative of data compression not selected responsive to said compared processor utilization value being greater than or equal to said second predetermined threshold value; and
transmitting said compression selection flag to the at least one other system, said compression selection flag being used by the at least one other system for selectively compressing data.

3. The method as recited in claim 2 wherein said predetermined threshold value and second predetermined threshold values are equal.

4. The method as recited in claim 2 wherein said step of transmitting said compression selection flag to the at least one other system is provided at a time of connection of the systems.

5. The method as recited in claim 2 wherein said compression selection flag is transmitted periodically to the at least one other system.

6. The method as recited in claim 2 wherein said step of transmitting said compression selection flag to the at least one other system is provided with each said transmitted data communication frame.

7. The method as recited in claim 1 further comprising the steps of:
storing the data communication frame without compressing the data communication frame responsive to an identified processor utilization value greater than or equal to said identified predetermined threshold value; and
compressing and storing the compressed data communication frame responsive to an identified processor utilization value less than said identified predetermined threshold value.

8. The method as recited in claim 1 wherein said step of identifying a predetermined threshold value includes the steps of:
storing each of a plurality of processor task queue threshold values with a corresponding communication line speed value; said processor task queue threshold value indicating a predetermined maximum number of queued processor tasks for selecting data compression for a corresponding communication line speed value;
identifying a current communication line speed value for the data communication frame to be transferred; and
identifying said stored processor task queue threshold value corresponding to said identified line speed value.

9. The method as recited in claim 8 further includes the steps of:
identifying a current task queue count for the processor;
comparing said identified current task queue count with said stored processor task queue threshold value corresponding to said identified line speed value; and
wherein said step of transmitting the data communication frame without compressing the data communication frame is provided responsive to said identified current task queue count being greater than said stored processor task queue threshold value.

10. The method as recited in claim 9 wherein said step of compressing the data communication frame and transmitting the compressed data communication frame is provided responsive to said identified current task queue count being less than or equal to said stored processor task queue threshold value.

11. The method as recited in claim 8 wherein said stored processor task queue threshold values are equal for all line speed values.

12. The method as recited in claim 1 further includes the step of:
identifying a state of a communications line for the data transfer; and
wherein said step of transmitting the data communication frame without compressing the data communication frame is provided responsive to an identified idle state of the communication line.

13. The method as recited in claim 12 further includes the steps of:
identifying a current transmit data queue value and identifying a communication line speed value responsive to an identified busy state of the communication line;
storing each of a plurality of transmit data queue threshold values with a corresponding communication line speed value; said transmit data queue threshold value indicating a predetermined minimum number of queued data bytes for selecting data compression for a corresponding communication line speed value;
comparing said identified current transmit data queue value with said stored transmit data queue threshold value corresponding to said identified line speed value; and
wherein said step of transmitting the data communication frame without compressing the data communication frame is provided responsive to an identified transmit data queue value less than said identified stored transmit data queue threshold value; and
wherein said step of compressing and transmitting the data communication frame is provided responsive to an identified data queue value greater than or equal to said identified stored data queue threshold value.

14. A method for selectively compressing each of a plurality of data communication frames for data transfer between a computer system having a processor and at least one other system, whereby each said data communication frame is selectively compressed based upon a current processor work load as determined by a processor utilization value, said method performed by the processor comprising the steps of:
periodically identifying the processor utilization value for the processor; said processor utilization value indicating said current processor work load;
identifying a predetermined threshold value;
before transmitting each said data communication frame, comparing said identified processor utilization value with said identified predetermined threshold value and based upon said comparison, determining which one of a first and a second compression algorithm to use in a data communication frame compression;
dynamically compressing and transmitting the data communication frame using said first compression algorithm responsive to an identified processor utilization value greater than said identified predetermined threshold value; and
dynamically compressing and transmitting the data communication frame using said second compression algorithm responsive to an identified processor utilization value less than or equal to said identified predetermined threshold value.

15. The method as recited in claim 14 wherein said first compression algorithm requires less processor time than required for said second compression algorithm.

16. A method for selectively compressing each of a plurality of data compression frames for data transfer on communications hardware between a computer system having a processor and at least one other system, whereby each said communication frame is selectively compressed based upon a current state of the communications hardware, said current state being one of an idle state and a busy state, said method performed by the processor comprising the steps of:
periodically identifying the state of the communications hardware for the data transfer;
identifying a current transmit data queue value and identifying a current communication line speed value responsive to an identified busy state of the communications hardware;
storing each of a plurality of transmit data queue threshold values with a corresponding communication line speed value, said transmit data queue threshold value indicating a predetermined minimum number of queued data bytes for selecting data compression for said corresponding communication line speed value;
before transmitting each said communication frame, comparing said identified current transmit data queue value with said stored transmit data queue threshold value corresponding to said identified current communication line speed value;
transmitting the data communication frame without compressing the data communication frame responsive to an identified idle state of the communications hardware, whereby said idle state is indicative of an identified transmit data queue value being less than said identified stored transmit data queue threshold value; and
dynamically compressing and transmitting the data communication frame responsive to an identified busy state of the communications hardware, whereby said busy state is indicative of an identified transmit data queue value being greater than or equal to said identified stored transmit data queue threshold value.

17. A computer system including a processor for selectively compressing each of a plurality of data communication frames for data transfer between the computer system and at least one other system, whereby each said data communication frame is selectively compressed based upon a current processor work load as determined by a processor utilization value, said processor comprising:
means for periodically identifying the processor utilization value for the processor, said processor utilization value indicating said current processor work load;
means for identifying a predetermined threshold value;
means for comparing, before transmitting each said data communication frame, said identified processor utilization value with said identified predetermined threshold value and based upon said comparison, determining whether or not said processor is too busy to perform a data communication frame compression;

means for transmitting the data communication frame without compressing the data communication frame responsive to an identified processor utilization value greater than said identified predetermined threshold value; and means for dynamically compressing and transmitting the data communication frame responsive to an identified processor utilization value less than or equal to said identified predetermined threshold value.

* * * * *

UNITED STATES PATENT AND TRADEMARK OFFICE
CERTIFICATE OF CORRECTION

PATENT NO. : 5,276,898

DATED : January 4, 1994

INVENTOR(S) : Kiel et al.

It is certified that error appears in the above-identified patent and that said Letters Patent is hereby corrected as shown below:

Column 3, line 39, "routing" should be changed to --routine--;

Column 3, line 66, "operated" should be changed to --operate--;

Column 7, line 48, "exitted" should be changed to --exited--; and     Column 8, line 18, in TABLE IV, "UTILIZITATION" should be changed to --UTILIZATION--.

Signed and Sealed this

Seventh Day of June, 1994

*Attest:*

BRUCE LEHMAN

*Attesting Officer*     *Commissioner of Patents and Trademarks*